(12) United States Patent
Takahashi et al.

(10) Patent No.: US 11,818,835 B2
(45) Date of Patent: Nov. 14, 2023

(54) MULTILAYER PRINTED WIRING BOARD, MULTILAYER METAL-CLAD LAMINATED BOARD, AND RESIN-COATED METAL FOIL

(71) Applicants: PANASONIC INTELLECTUAL PROPERTY MANAGEMENT CO., LTD., Osaka (JP); TOMOEGAWA CO., LTD., Tokyo (JP)

(72) Inventors: Hiroaki Takahashi, Mie (JP); Kiyotaka Komori, Mie (JP); Masaya Koyama, Mie (JP); Jun Tochihira, Shizuoka (JP); Ryu Harada, Shizuoka (JP)

(73) Assignees: PANASONIC INTELLECTUAL PROPERTY MANAGEMENT CO., LTD., Osaka (JP); TOMOEGAWA CO., LTD., Tokyo (JP)

( * ) Notice: Subject to any disclaimer, the term of this patent is extended or adjusted under 35 U.S.C. 154(b) by 195 days.

(21) Appl. No.: 17/172,769

(22) Filed: Feb. 10, 2021

(65) Prior Publication Data

US 2021/0176854 A1  Jun. 10, 2021

Related U.S. Application Data

(63) Continuation of application No. 15/542,766, filed as application No. PCT/JP2016/000010 on Jan. 5, 2016, now abandoned.

(30) Foreign Application Priority Data

Jan. 19, 2015 (JP) .................................. 2015-008007
Oct. 27, 2015 (JP) .................................. 2015-210595

(51) Int. Cl.
*H05K 1/02* (2006.01)
*B32B 27/20* (2006.01)
(Continued)

(52) U.S. Cl.
CPC ............. *H05K 1/024* (2013.01); *B32B 15/08* (2013.01); *B32B 15/085* (2013.01); *B32B 15/20* (2013.01);
(Continued)

(58) Field of Classification Search
None
See application file for complete search history.

(56) References Cited

U.S. PATENT DOCUMENTS 5,761,801 A * 6/1998 Gebhardt ............... H05K 3/045
29/846
7,413,791 B2  8/2008 Inoue et al.
(Continued)

FOREIGN PATENT DOCUMENTS

CN   104194262    * 12/2014 ........... B32B 15/092
JP   2002-185095     6/2002
(Continued)

OTHER PUBLICATIONS

Ma—CN 104194262 A—MT—semi-cured thermoset—2014 (Year: 2014).*

(Continued)

*Primary Examiner* — John Vincent Lawler
(74) *Attorney, Agent, or Firm* — GREENBLUM & BERNSTEIN, P.L.C.

(57) ABSTRACT

A multilayer printed wiring board including one or more insulating layers 2 and at least one conductive layer 1 which are stacked alternately is disclosed. The one or more insulating layers 2 include at least one liquid crystal polymer resin layer 4 so that each of the one or more insulating layers 2 includes at least one layer selected from a group consisting of at least one polyolefin resin layer 3 and the at least one liquid crystal polymer resin layer 4. A percentage by volume of the at least one liquid crystal polymer resin layer 4

(Continued)

relative to the one or more insulating layers 2 is within a range of 5 to 90%.

20 Claims, 4 Drawing Sheets

(51) Int. Cl.
| | |
|---|---|
| B32B 27/32 | (2006.01) |
| B32B 15/08 | (2006.01) |
| H05K 1/03 | (2006.01) |
| H05K 3/02 | (2006.01) |
| B32B 15/085 | (2006.01) |
| B32B 15/20 | (2006.01) |
| H05K 3/46 | (2006.01) |

(52) U.S. Cl.
CPC ............ *B32B 27/20* (2013.01); *B32B 27/32* (2013.01); *H05K 1/036* (2013.01); *H05K 1/0373* (2013.01); *H05K 1/0393* (2013.01); *H05K 3/022* (2013.01); *H05K 3/4673* (2013.01); *B32B 2270/00* (2013.01); *B32B 2307/202* (2013.01); *B32B 2307/206* (2013.01); *B32B 2457/08* (2013.01); *H05K 2201/0133* (2013.01); *H05K 2201/0141* (2013.01); *H05K 2201/0158* (2013.01); *H05K 2201/0195* (2013.01)

(56) References Cited

U.S. PATENT DOCUMENTS

| | | | |
|---|---|---|---|
| 7,838,576 B2 | 11/2010 | Inoue et al. | |
| 8,835,768 B2 | 9/2014 | Sekine | |
| 2003/0170431 A1* | 9/2003 | Oguni | C08J 7/0423 |
| | | | 428/209 |
| 2004/0099367 A1* | 5/2004 | Nakamura | H05K 3/4661 |
| | | | 29/830 |
| 2004/0146692 A1 | 7/2004 | Inoue et al. | |
| 2005/0183883 A1* | 8/2005 | Bois | H05K 3/4688 |
| | | | 174/255 |
| 2007/0107837 A1* | 5/2007 | Dutton | H05K 3/4611 |
| | | | 156/182 |
| 2008/0254257 A1 | 10/2008 | Inoue et al. | |
| 2009/0191387 A1* | 7/2009 | Paul | B32B 15/08 |
| | | | 428/494 |
| 2011/0215480 A1* | 9/2011 | Gorczyca | H01L 23/4985 |
| | | | 257/E21.585 |
| 2011/0287243 A1* | 11/2011 | Carney | H05K 9/0088 |
| | | | 428/339 |
| 2011/0318590 A1* | 12/2011 | Maki | B32B 27/36 |
| | | | 156/244.11 |
| 2012/0132458 A1* | 5/2012 | Sekine | H05K 1/0393 |
| | | | 174/254 |
| 2013/0213697 A1 | 8/2013 | Palaniswamy | |
| 2014/0191387 A1 | 7/2014 | Jin | |
| 2014/0231123 A1 | 8/2014 | Onodera | |
| 2015/0195921 A1* | 7/2015 | Onodera | H05K 3/4691 |
| | | | 174/258 |

FOREIGN PATENT DOCUMENTS

| | | |
|---|---|---|
| JP | 2006-516297 | 6/2006 |
| JP | 2011-216841 | 10/2011 |
| JP | 2011-233822 | 11/2011 |
| JP | 2012-119446 | 6/2012 |
| WO | 2013/099172 | 7/2013 |
| WO | 2014/147903 | 9/2014 |

OTHER PUBLICATIONS

ISR issued in WIPO Patent Application No. PCT/JP2016/000010, dated Mar. 15, 2016, English translation.

Written Opinion issued in WIPO Patent Application No. PCT/JP2016/000010, dated Mar. 15, 2016, English translation.

EpoTek—Tech tip 20—B-stage epoxy, 2012.

* cited by examiner

MULTILAYER PRINTED WIRING BOARD, MULTILAYER METAL-CLAD LAMINATED BOARD, AND RESIN-COATED METAL FOIL

CROSS-REFERENCE TO RELATED APPLICATIONS

This is a Continuation Application of U.S. patent application Ser. No. 15/542,766, filed Jul. 11, 2017, which is a National Stage Entry of International Patent Application No. PCT/JP2016/000010, filed Jan. 5, 2016, which claims priority to Japanese Patent Application No. 2015-210595, filed Oct. 27, 2015, and Japanese Patent Application No. 2015-008007, filed Jan. 19, 2015. The entire disclosure of each of the above-identified applications, including the specification, drawings, and claims, is incorporated by reference herein in its entirety.

TECHNICAL FIELD

The present invention generally relates to multilayer printed wiring boards, multilayer metal-clad laminated boards, and resin-coated metal foils, and specifically relates to a multilayer printed wiring board, a multilayer metal-clad laminated board, and a resin-coated metal foil which are used in electronic devices processing high speed signals.

BACKGROUND ART

Aiming to realize ubiquitous society, speed of information transmission has been continuously increasing faster and faster. Printed wiring boards such as fluororesin boards and polyphenylene ether (PPE) resin boards are currently used for processing high speed signals. For example, a material for a polyphenylene ether board is disclosed in JP 2006-516297 A (hereinafter referred to as "Document 1").

In addition, there have been proposed multilayer printed wiring boards which can be processed in the same manner as conventional printed wiring boards such as epoxy resin boards and polyimide resin boards, reduce transmission loss of high speed signals, and suppress disconnection of through hole plating or the like due to improved thermal shock resistance. For example, as disclosed in JP 2011-216841 A (hereinafter referred to as "Document 2"), the above printed wiring boards include conductive layers and insulating layers stacked alternately, and the insulating layers include: one or more thermosetting resin layers produced by impregnating glass cloth with thermosetting resin containing an inorganic filler and polyphenylene ether resin and curing it; and one or more liquid crystal polymer resin layers which take up 5 to 80 volume % of the entire insulating layers.

SUMMARY OF INVENTION

As mentioned above, the fluororesin boards and the PPE resin boards are the mainstream of the current cutting edge printed wiring boards for processing high speed signals.

However, in manufacturing the fluororesins boards, processing methods used for conventional printed wiring boards such as epoxy resin boards and polyimide resin boards cannot be employed. Instead, special processing methods are required, which is problematic in terms of cost. In addition, since the fluororesins boards have large thermal expansion coefficients and are low in thermal shock resistance, a problem such as occurrence of disconnection of through hole plating may rise.

On the other hand, in manufacturing the PPE resin boards as described in Document 1, the processing methods used for conventional printing wiring boards such as epoxy resin boards and polyimide resin boards can be employed. However, there exists a problem that the PPE resin boards are inferior to the fluororesins boards in terms of transmission characteristics of high speed signals.

As for the multilayer printed wiring board of Document 2, since the liquid crystal polymer resin layer(s) takes up 5 to 80 volume % of the entire insulating layers, transmission loss of high speed signals can be reduced. Also, since the rest of the insulating layers excluding the liquid crystal polymer resin layer(s) is strengthened with the glass cloth and includes the thermosetting resin layer(s) containing the inorganic filler, thermal shock resistance is increased and disconnection of through hole plating or the like can be suppressed.

However, since the insulating layers of the above multilayer printed wiring board include the thermosetting resin layer(s) strengthened with the glass cloth, there exists a problem that the above multilayer printed wiring board is not suitable for substrates required to have bendability.

The present invention has been made in view of the above described circumstances, and aims to provide a multilayer printed wiring board, a multilayer metal-clad laminated board, and a resin-coated metal foil which can be processed in the same manner as conventional printed wiring boards such as epoxy resin boards and polyimide resin boards, reduce transmission loss of high speed signals, and be used as a bendable material.

The multilayer printed wiring board according to the present invention includes
- one or more insulating layers and at least one conductive layer which are stacked alternately,
- the one or more insulating layers include at least one liquid crystal polymer resin layer so that each of the one or more insulating layers includes at least one layer selected from a group consisting of at least one polyolefin resin layer and the at least one liquid crystal polymer resin layer, and
- a percentage by volume of the at least one liquid crystal polymer resin layer relative to the one or more insulating layers is within a range of 5 to 90%.

The multilayer metal-clad laminated board according to the present invention includes:
- one or more insulating layers and at least one conductive layer which are stacked alternately; and
- at least one metal layer serving as at least one of opposite outermost layers of the multilayer metal-clad laminated board,
- the one or more insulating layers include at least one liquid crystal polymer resin layer so that each of the one or more insulating layers includes at least one layer selected from a group consisting of at least one polyolefin resin layer and the at least one liquid crystal polymer resin layer,
- a percentage by volume of the at least one liquid crystal polymer resin layer relative to the one or more insulating layers is within a range of 5 to 90%,
- each of the at least one polyolefin resin layer contains a component (A) representing polyolefin-based elastomer and a component (B) representing thermosetting resin, and
- a percentage by weight of the component (A) representing polyolefin-based elastomer relative to the at least one polyolefin resin layer is within a range of 50 to 95%.

The resin-coated metal foil according to the present invention includes:

a metal foil; and a stack on the metal foil, the stack includes a first insulating layer and a second insulating layer which are arranged in this order from the metal foil, the first insulating layer is: an insulating layer including not at least one polyolefin resin layer but at least one liquid crystal polymer resin layer; or an insulating layer including the at least one polyolefin resin layer and the at least one liquid crystal polymer resin layer, the second insulating layer includes at least one semi-cured polyolefin resin layer, a percentage of volume of the at least one liquid crystal polymer resin layer relative to total volume of the first insulating layer and the second insulating layer is within a range of 5 to 90%, each of the at least one polyolefin resin layer and the at least one semi-cured polyolefin resin layer contains a component (A) representing polyolefin-based elastomer and a component (B) representing thermosetting resin, and a percentage of weight of the component (A) representing polyolefin-based elastomer relative to total weight of the at least one polyolefin resin layer and the at least one semi-cured polyolefin resin layer is within a range of 50 to 95%.

DESCRIPTION OF EMBODIMENTS

Embodiments according to the present invention are described hereinafter.

<Multilayer Metal-Clad Laminated Board>

Figure 2A:
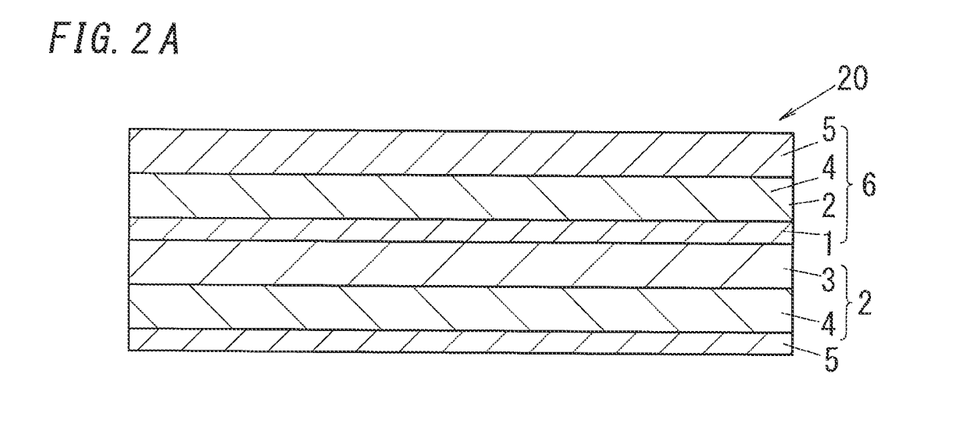
FIG. 2A is a schematic cross-sectional view illustrating another example of a multilayer metal-clad laminated board.

A multilayer metal-clad laminated board 20 of the present embodiment is first explained. The multilayer metal-clad laminated board 20 can be used as a material for a multilayer printed wiring board 10 to be explained later. FIG. 2A illustrates an example of the multilayer metal-clad laminated board 20. The multilayer metal-clad laminated board 20 includes: one or more insulating layers 2 and at least one conductive layer 1 which are stacked alternately; and at least one metal layer 5 serving as at least one of opposite outermost layers of the multilayer metal-clad laminated board 20. The at least one conductive layer 1 actually has one or more patterned conductors constituting various circuits; however, the at least one conductive layer 1 is illustrated in a simplified manner in FIG. 2A. The at least one metal layer 5 is, for example, a layer formed by planarly spreading metal. As explained, the multilayer metal-clad laminated board 20 includes the at least one conductive layer 1 therein. The multilayer metal-clad laminated board 20 illustrated in FIG. 2A has two insulating layers 2, one conductive layer 1, and two metal layers 5. However, the number of insulating layers 2, the number of conductive layers 1, and the number of metal layers 5 are not particularly limited. In the multilayer metal-clad laminated board 20 illustrated in FIG. 2A, the two insulating layers 2 are stacked with the conductive layer 1 in-between, and the two metals layers 5 are arranged as the opposite outermost layers in a thickness direction (stack direction) of the multilayer metal-clad laminated board 20. The multilayer metal-clad laminated board 20 can be manufactured by using: a printed wiring board 6 to be explained later; a polyolefin resin sheet and a liquid crystal polymer film which can be used to form the one or more insulating layer 2; and metal foils such as copper foils which can be used to form the at least one conductive layer 1 and the at least one metal layer 5. The polyolefin resin sheet is made of polyolefin resin and used to form a polyolefin resin layer 3. The liquid crystal polymer film is made of liquid crystal polymer resin and used to form a liquid crystal polymer resin layer 4.

The one or more insulating layers 2 include at least one liquid crystal polymer resin layer such that each of the one or more insulating layers 2 includes: (1) insulating layer made by use of at least one polyolefin resin layer 3 without using any liquid crystal polymer resin layers 4; (2) insulating layer made by use of the at least one liquid crystal polymer resin layer 4 without using any polyolefin resin layers 3; or (3) insulating layer made by use of the at least one polyolefin resin layer 3 and the at least one liquid crystal polymer resin layer 4. Note that the insulating layer 2 made by use of the at least one polyolefin resin layer 3 and the at least one liquid crystal polymer resin layer 4 can be interpreted as the insulating layer 2 including the at least one polyolefin resin layer 3 and the at least one liquid crystal polymer resin layer 4. Since each of the one or more insulating layers 2 includes (1), (2) or (3) as explained above instead of fluororesin layers which require special processing, the multilayer metal-clad laminated board 20 can be processed in the same manner as conventional printed wiring boards such as epoxy resin boards and polyimide resin boards.

Figure 4A:
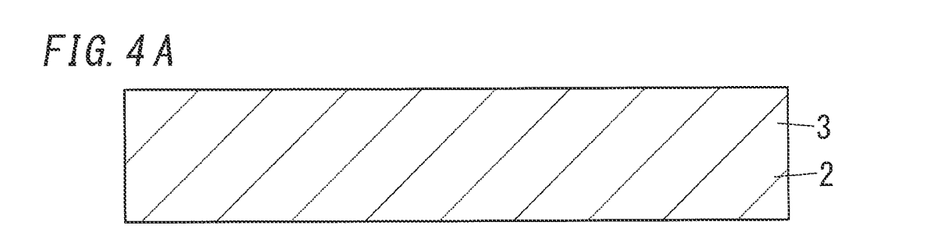
FIG. 4A is a schematic cross-sectional view illustrating an example of an insulating layer.
Figure 4B:
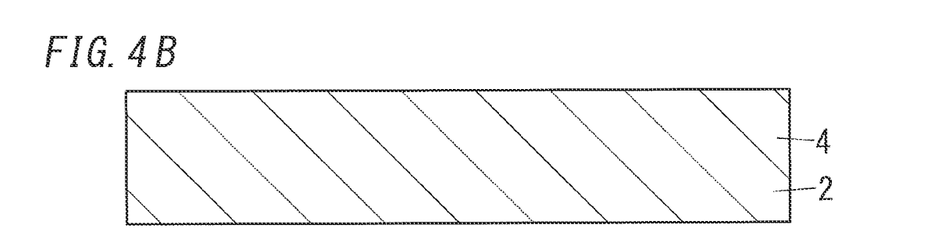
FIG. 4B is a schematic cross-sectional view illustrating another example of the insulating layer.
Figure 4C:
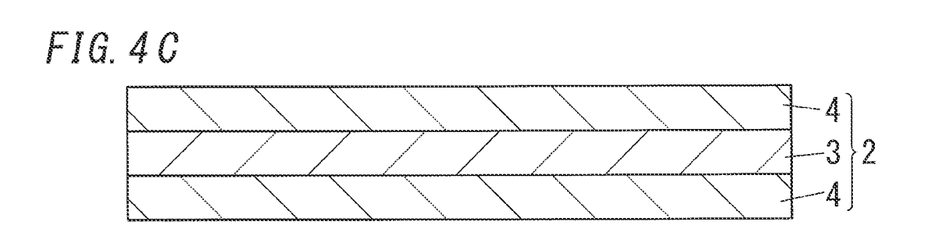
FIG. 4C is a schematic cross-sectional view illustrating another example of the insulating layer.
Figure 4D:
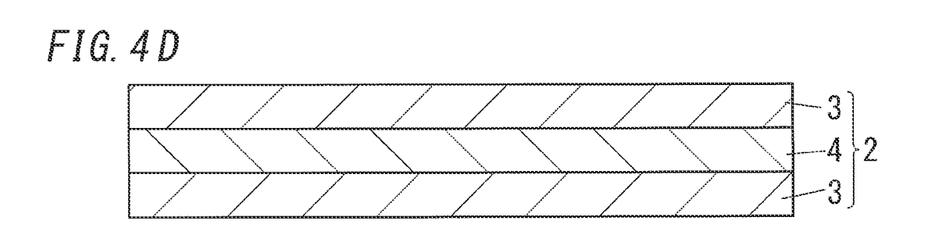
FIG. 4D is a schematic cross-sectional view illustrating another example of the insulating layer.
Figure 4E:
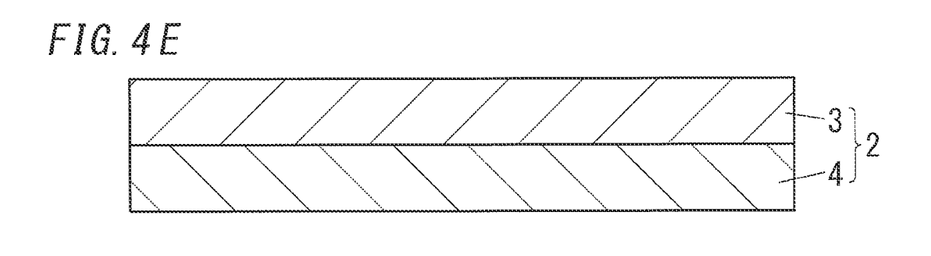
FIG. 4E, is a schematic cross-sectional view illustrating another example of the insulating layer.

FIG. 4A to FIG. 4E illustrate specific examples of layered structure of the insulating layer 2. FIG. 4A illustrates the insulating layer 2 including the polyolefin resin layer 3 only, which can be formed by heating and curing one or more polyolefin resin sheets. In this case, one polyolefin sheet may be used, and a stack of two or more polyolefin sheets may also be used. FIG. 4B illustrates the insulating layer 2 including the liquid crystal polymer resin layer 4 only, which can be formed of one or more liquid crystal polymer films. In this case, one liquid crystal polymer film may be used, and a stack of two or more liquid crystal polymer films may also be used. FIG. 4C illustrates the insulating layer 2 in which one polyolefin resin layer 3 is placed between two liquid crystal polymer resin layers 4, which can be formed by heating and curing a composite sheet prepared by arranging two liquid crystal polymer films on opposite sides of one polyolefin resin sheet. FIG. 4D illustrates the insulating layer 2 in which one liquid crystal polymer resin layer 4 is placed between two polyolefin resin layers 3, which can be formed by heating and curing a composite sheet prepared by arranging two polyolefin resin sheets on opposite sides of one liquid crystal polymer film. FIG. 4E illustrates the insulating layer 2 in which one polyolefin resin layer 3 and one liquid crystal polymer resin layer 4 are stacked, which can be formed by heating and curing a composite sheet prepared by stacking one polyolefin resin sheet and one liquid crystal polymer film. In cases of FIG. 4A to FIG. 4E, one polyolefin sheet may be used, and a stack of two or more polyolefin sheets may also be used. Similarly, one liquid crystal polymer film may be used, and a stack of two or more liquid crystal polymer films may also be used.

Each of the at least one polyolefin resin layer 3 preferably contains a component (A) representing polyolefin-based elastomer and a component (B) representing thermosetting resin, and a percentage by weight of the component (A) representing polyolefin-based elastomer relative to the at least one polyolefin resin layer 3 is preferably within a range of 50 to 95%. In such a case where the at least one polyolefin resin layer 3 contains a large amount of the component (A) representing polyolefin-based elastomer, the multilayer metal-clad laminated board 20 and the multilayer printed wiring board 10 manufactured by use of the multilayer metal-clad laminated board 20 can have increased flexibility, leading to enhanced bendability.

The component (A) representing polyolefin-based elastomer preferably contains one or more kinds of compounds selected from a group consisting of: polystyrene-poly(ethylene/propylene)block-polystyrene copolymer; polystyrene-poly(ethylene-ethylene/propylene)block-polystyrene copolymer; polystyrene-poly(ethylene/butylene)block-polystyrene copolymer; polystyrene-polyisoprene block copolymer; hydrogenated polystyrene-polyisoprene-polybutadiene block copolymer; polystyrene-poly(butadiene/butylene)block-polystyrene copolymer; ethylene-glycidyl methacrylate copolymer; ethylene-glycidyl methacrylate-acrylic acid methyl copolymer; and ethylene-glycidyl methacrylate-vinyl acetate copolymer.

The component (B) representing thermosetting resin preferably contains one or more kinds of compounds selected from a group consisting of epoxy resin, phenol resin, bismaleimide resin, and polyphenylene ether oligomer having vinyl groups at both ends.

Each of the at least one polyolefin resin layer 3 may further contain a component (C) representing curing accelerator.

Each of the at least one polyolefin resin layer 3 may further contain a component (D) representing filler.

On the other hand, each of the at least one liquid crystal polymer resin layer 4 may be a film made of liquid crystal polymer (LCP) resin. Examples of the liquid crystal polymer resin may include: polycondensate of ethylene terephthalate and para-hydroxy benzoic acid, polycondensate of phenol and phthalic acid and para-hydroxy benzoic acid; and polycondensate of 2,6-hydroxy naphthoic acid and para-hydroxy benzoic acid.

<Method of Manufacturing Multilayer Metal-Clad Laminated Board>

Figure 5A:
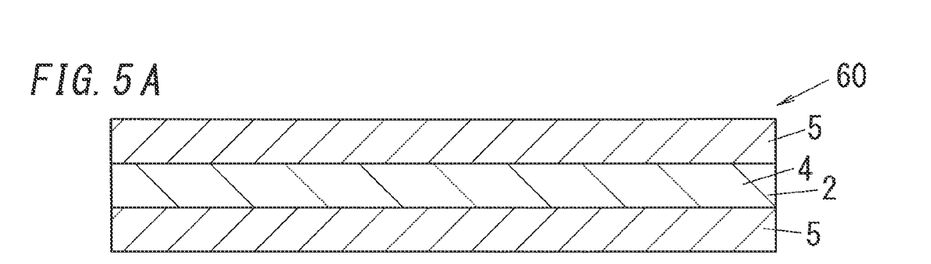
FIG. 5A is a schematic cross-sectional view illustrating an example of a metal-clad laminated board.
Figure 5B:
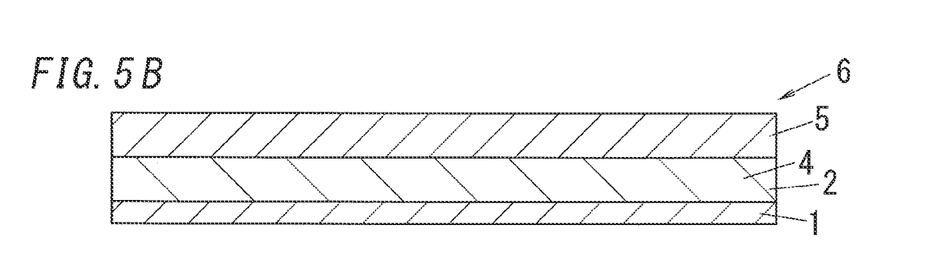
FIG. 5B is a schematic cross-sectional view illustrating another example of a printed wiring board.

The multilayer metal-clad laminated board 20 can be manufactured by, for example, the following method. First, a metal-clad laminated board 60 is prepared. The metal-clad laminated board 60 serves as a material for the multilayer metal-clad laminated board 20. Examples of the metal-clad laminated board 60 may include a one-sided metal-clad laminated board in which a metal foil is attached to one surface of the insulating layer 2 illustrated in any one of FIG. 4A to FIG. 4E and a double-sided metal-clad laminated board in which metal foils are attached to both surfaces of the insulating layer 2 illustrated in any one of FIG. 4A to FIG. 4E. As one of these examples, FIG. 5A illustrates the metal-clad laminated board 60 (double-sided metal-clad laminated board) in which metal layers 5 are provided to both surfaces of the insulating layer 2 illustrated in FIG. 4B. In this example, the insulating layer 2 is formed of the liquid crystal polymer resin layer 4 and the metal layers 5 are formed of the metal foils. Hereinafter, the example using the metal-clad laminated board 60 (referring to FIG. 5A) in which the metal foils are attached to both surfaces of the liquid crystal polymer resin layer 4 is explained; however, the present invention is not limited to this example. Unnecessary parts of one of the metal layers 5 of the metal-clad laminated board 60 are removed in order to form the conductive layer 1. Accordingly, the metal-clad laminated board 60 is turned into the printed wiring board 6 as illustrated in FIG. 5B. More specifically, in FIG. 5B, the unnecessary parts of one of the metal layers 5, corresponding to one of opposite outermost layers, of the metal-clad laminated board 60 are removed by a method such as etching and thereby the conductive layer 1 is formed. The other of the metal layers 5 remains as the other of the opposite outermost layers. Note that the conductive layer 1 actually has one or more patterned conductors constituting various circuits; however, the conductive layer 1 is illustrated in a simplified manner in FIG. 5B. When the conductive layer 1 includes a circuit for transmitting high speed signals or a circuit having a long transmission distance, the conductive layer 1 is preferably formed so as to be in contact with the liquid crystal polymer resin layer 4, as illustrated in FIG. 5B. In this case, transmission loss of high speed signals can be reduced. It is also preferable to form the conductive layer 1 so as to be in contact with the liquid crystal polymer resin layer 4 in terms of improving heat resistant of the multilayer metal-clad laminated board 20 and the multilayer printed wiring board 10 manufactured by using it.

Subsequently, the printed wiring board 6 and at least one material selected from a group consisting of at least one polyolefin resin sheet and at least one liquid crystal polymer film are stacked alternately, and then heated and pressed to form the multilayer metal-clad laminated board 20 as illustrated in FIG. 2A. The multilayer metal-clad laminated board 20 illustrated in FIG. 2A can be manufactured specifically by stacking a polyolefin resin sheet for forming the polyolefin resin layer 3, a liquid crystal polymer film for forming the liquid crystal polymer resin layer 4, and a metal foil for forming the metal layer 5 in this order on the conductive layer 1 of the printed wiring board 6 illustrated in FIG. 5B and then heating and pressing them. One of the insulating layers 2 is constituted by two adjacent layers of the polyolefin resin layer 3 and the liquid crystal polymer resin layer 4.

Note that the number of printed wiring boards 6, the number of polyolefin resin sheets, the number of liquid crystal polymer films, and the number of metal foils may be increased in the multilayer metal-clad laminated board 20 illustrated in FIG. 2A to increase the number of layers in the multilayer metal-clad laminated board 20. Accordingly further layering can be carried out.

The multilayer metal-clad laminated board 20 illustrated in FIG. 2A has a structure such that the printed wiring board 6 is arranged at an outer side of the multilayer metal-clad laminated board 20. In this case, the conductive layer 1 serves as one of opposite outermost layers of the printed wiring board 6 and the metal layer 5 serves as the other of the opposite outermost layers of the printed wiring board 6. The conductive layer 1 includes one or more patterned conductors constituting various circuits, and the metal layer 5 is, for example, a layer formed by spreading metal planarly. When manufacturing the multilayer metal-clad laminated board 20, the printed wiring board 6 is arranged so that the conductive layer 1 is placed at an inner part of the multilayer metal-clad laminated board 20 and the metal layer 5 is placed at the outer side of the multilayer metal-clad laminated board 20. On the other hand, when the multilayer metal-clad laminated board 20 has a structure such that the entire printed wiring board 6 is arranged at the inner part of the multilayer metal-clad laminated board 20, which is not illustrated in figures, the printed wiring board 6 in use has two conductive layers 1 serving as both of the opposite outermost layers of the printed wiring board 6. Both of these conductive layers 1 are included inside the multilayer metal-clad laminated board 20.

Figure 2B:
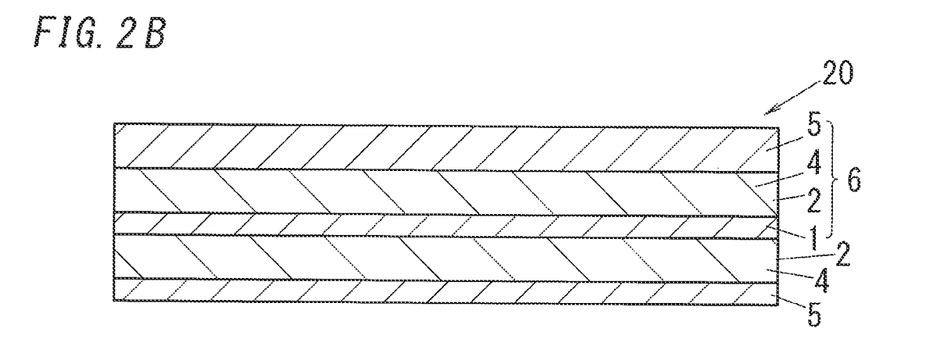
FIG. 2B is a schematic cross-sectional view illustrating another example of the multilayer metal-clad laminated board.

FIG. 2B illustrates another example of the multilayer metal-clad laminated board 20. When manufacturing this multilayer metal-clad laminated board 20, the one-sided metal-clad laminated board may be used in addition to the above explained printed wiring board 6. An example of the one-sided metal-clad laminated board is a one-sided metal-clad laminated board in which a metal layer 5 is provided to one surface of the insulating layer 2 illustrated in FIG. 4B. In this example, the insulating layer 2 is formed of the liquid crystal polymer resin layer 4 and the metal layer 5 is formed of a metal foil. Since liquid crystal polymer is generally thermoplastic resin, layering can be easily performed by placing the insulating layer 2 of the above one-sided metal-clad laminated board on the printed wiring board 6 and then heating and pressing them at a temperature high enough for the liquid crystal polymer to melt.

The one or more insulating layers 2 includes at least one liquid crystal polymer resin layer 4 so that each of the one or more insulating layers 2 of the multilayer metal-clad laminated board 20 includes: (1) insulating layer made by use of at least one polyolefin resin layer 3 without using any liquid crystal polymer resin layers 4; (2) insulating layer made by use of the at least one liquid crystal polymer resin layer 4 without using any polyolefin resin layers 3; or (3) insulating layer made by use of the at least one polyolefin resin layer 3 and the at least one liquid crystal polymer resin layer 4. Accordingly, the multilayer metal-clad laminated board 20 can be processed in the same manner as conventional printed wiring boards such as epoxy resin boards and polyimide resin boards. A percentage by volume of the at least one liquid crystal polymer resin layer 4 relative to the one or more insulating layers 2 is within a range of 5 to 90%. Accordingly, transmission loss of high speed signals can be reduced. In a specific example, the multilayer metal-clad laminated board 20 illustrated in FIG. 2A has two insulating layers 2 and two liquid crystal polymer resin layers 4. Therefore, the percentage by volume of the two liquid crystal polymer resin layers 4 relative to the two insulating layers 2 lies within a range of 5 to 90%. Specifications such as thicknesses and the numbers of printed wiring boards 6, polyolefin resin sheets, and liquid crystal polymer films should be determined and adjusted in advance so that the above explained conditions are satisfied. It is also preferable in this case to arrange the conductive layer 1 including a circuit for transmitting high speed signals or a circuit having a long transmission distance so that the conductive layer 1 is in contact with the liquid crystal polymer resin layer 4. Accordingly, transmission loss of high speed signals can be reduced. It is also preferable to form the conductive layer 1 so that the conductive layer 1 is in contact with the liquid crystal polymer resin layer 4 having high heat resistance in terms of improving heat resistant of the multilayer metal-clad laminated board 20.

Note that layering can be performed once, twice, or more times. Also, the number of layers is not particularly limited but can be determined depending on the design of the desired multilayer metal-clad laminated board 20.

<Resin-Coated Metal Foil>

Figure 3A:
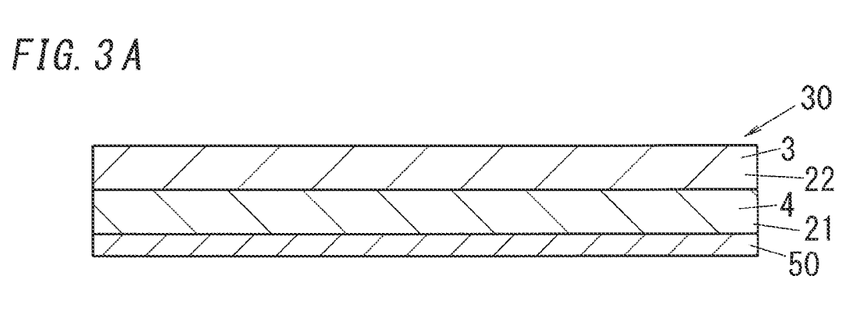
FIG. 3A is a schematic cross-sectional view illustrating an example of a resin-coated metal foil.
Figure 3B:
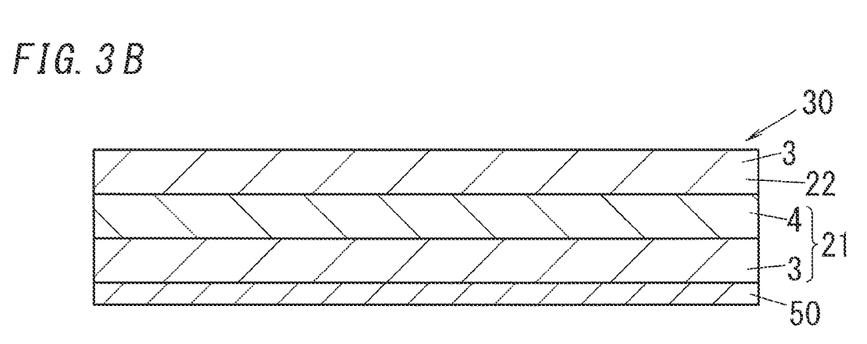
FIG. 3B is a schematic cross-sectional view illustrating another example of the resin-coated metal foil.

Next, a resin-coated metal foil 30 according to the present embodiment is explained. The resin-coated metal foil 30 can be used as a material for the aforementioned multilayer metal-clad laminated board 20 and the multilayer printed wiring board 10 to be explained later. FIG. 3A and FIG. 3B illustrate specific examples of the resin-coated metal foil 30. The resin-coated metal foil 30 includes a metal foil 50 and a stack on the metal foil 50. The stack includes a first insulating layer 21 and a second insulating layer 22 which are arranged in this order from the metal foil 50.

The first insulating layer 21 is (1) insulating layer including not at least one polyolefin resin layer 3 but at least one liquid crystal polymer resin layer 4 or (2) insulating layer including the at least one polyolefin resin layer 3 and the at least one liquid crystal polymer resin layer 4. In the resin-coated metal foil 30 illustrated in FIG. 3A, the first insulating layer 21 includes the at least one liquid crystal polymer resin layer 4 and does not include any polyolefin resin layers 3. In the resin-coated metal foil 30 illustrated in FIG. 3B, the first insulating layer 21 includes the at least one polyolefin resin layer 3 and the at least one liquid crystal polymer resin layer 4. In FIG. 3B, the polyolefin resin layer 3 of the first insulating layer 21 is placed on the metal foil 50; however, the liquid crystal polymer resin layer 4 of the first insulating layer 21 may be placed on the metal foil 50. By the way, liquid crystal polymer resin is generally thermoplastic resin and polyolefin resin is generally thermosetting resin. Therefore, in a case where the first insulating layer 21 includes the at least one liquid crystal polymer resin layer 4 and does not include any polyolefin resin layers 3, the first insulating layer 21 is in solid state at room temperature, melts when heated, and returns to its solid state when cooled. On the other hand, in a case where the first insulating layer 21 includes the at least one polyolefin resin layer 3 and the at least one liquid crystal polymer resin layer 4, the first insulating layer 21 is in cured state or solid state at room temperature and melts partially when heated, and the partially melted part returns to its solid state when cooled.

The second insulating layer 22 includes at least one semi-cured polyolefin resin layer 3. Semi-cured state is defined as a middle stage of a curing reaction, which lies between an A stage of varnish state and a C stage of completely cured state. The semi-cured polyolefin resin layer 3 is in cured state at which curing has progressed to an extent where stickiness is not observed at room temperature. When heated, the semi-cured polyolefin resin layer 3 first melts and then completely cured to form the polyolefin resin layer 3 in the C stage.

A percentage of volume of the at least one liquid crystal polymer resin layer 4 relative to total volume of the first insulating layer 21 and the second insulating layer 22 is within a range of 5 to 90%. In this case, transmission loss of high speed signals can be reduced.

Each of the at least one polyolefin resin layer 3 of the first insulating layer 21 and the at least one semi-cured polyolefin resin layer 3 of the second insulating layer 22 contains the component (A) representing polyolefin-based elastomer and the component (B) representing thermosetting resin. In a case where the first insulating layer 21 includes the at least one liquid crystal polymer resin layer 4 and does not include any polyolefin resin layers 3, the at least one semi-cured polyolefin resin layer 3 of the second insulating layer 22 contains the component (A) representing polyolefin-based elastomer and the component (B) representing thermosetting resin.

A percentage of weight of the component (A) representing polyolefin-based elastomer relative to total weight of the at least one polyolefin resin layer 3 of the first insulating layer 21 and the at least one semi-cured polyolefin resin layer 3 of the second insulating layer 22 is within a range of 50 to 95%. In a case where the first insulating layer 21 includes the at least one liquid crystal polymer resin layer 4 and does not include any polyolefin resin layers 3, a percentage of weight of the component (A) representing polyolefin-based elastomer relative to weight of the at least one semi-cured polyolefin resin layer 3 of the second insulating layer 22 is within a range of 50 to 95%. When the polyolefin resin layer(s) 3 in the resin-coated metal foil 30 contains a large amount of the component (A) representing polyolefin-based elastomer, the multilayer metal-clad laminated board 20 and the multilayer printed wiring board 10 manufactured by using thereof can have increased flexibility, leading to enhanced bendability.

The resin-coated metal foil 30 can be manufactured by, for example, following method. First, a resin sheet or a resin film is placed on a surface of the metal foil 50, which are then heated and pressed to form the first insulating layer 21. Examples of the resin sheet may include a polyolefin resin sheet, and examples of the resin film may include a liquid crystal polymer film. There is no substantial difference in concept between a sheet and a film. Subsequently, resin varnish is applied on a surface of the first insulating layer 21 and then dried. Examples of the resin varnish may include polyolefin resin varnish. Accordingly, the second insulating layer 22 is formed, and thereby the resin-coated metal foil 30 is obtained. In the resin-coated metal foil 30, the second insulating layer 22 is in semi-cured state.

Specifically, in manufacturing the resin-coated metal foil 30 illustrated in FIG. 3A, a liquid crystal polymer film is placed on a surface of the metal foil 50, which are then heated and pressed to form the first insulating layer 21 made of the liquid crystal polymer resin layer 4. Subsequently, polyolefin resin varnish is applied on a surface of the first insulating layer 21 and then dried. Accordingly, the second insulating layer 22 made of the semi-cured polyolefin resin layer 3 is formed, and thereby the resin-coated metal foil 30 as illustrated in FIG. 3A is obtained.

In manufacturing the resin-coated metal foil 30 illustrated in FIG. 3B, a polyolefin resin sheet and a liquid crystal polymer film are stacked in this order on a surface of the metal foil 50, which are then heated and pressed to form the first insulating layer 21 including the polyolefin resin layer 3 and the liquid crystal polymer resin layer 4. Subsequently, polyolefin resin varnish is applied on a surface of the first insulating layer 21 and then dried. Accordingly, the second insulating layer 22 made of the semi-cured polyolefin resin layer 3 is formed, and thereby the resin-coated metal foil 30 as illustrated in FIG. 3B is manufactured.

The multilayer metal-clad laminated board 20 illustrated in FIG. 2A can also be manufactured by following method using the resin-coated metal foil 30. The multilayer metal-clad laminated board 20 illustrated in FIG. 2A can be manufactured by placing the second insulating layer 22 of the resin-coated metal foil 30 illustrated in FIG. 3A on the conductive layer 1 of the printed wiring board 6 illustrated in FIG. 5B and then heating and pressing them. When the second insulating layer 22 of the resin-coated metal foil 30 is turned from semi-cured state into completely cured state, the printed wiring board 6 and the resin-coated metal foil 30 adhere to each other. Two adjacent layers of the first insulating layer 21 and the second insulating layer 22 (the polyolefin resin layer 3 after cured) form one insulating layer 2. Accordingly, the second insulating layer 22 (the semi-cured polyolefin resin layer 3) of the resin-coated metal foil 30 functions as an adhesive layer. Since a melting point of semi-cured polyolefin resin is far less than a melting point of liquid crystal polymer resin, the resin-coated metal foil 30 according to the present embodiment can be formed under a milder condition, leading to excellent processability. Therefore, the resin-coated metal foil 30 is a suitable material for the multilayer metal-clad laminated board 20 and the multilayer printed wiring board 10.

<Multilayer Printed Wiring Board>

Figure 1:
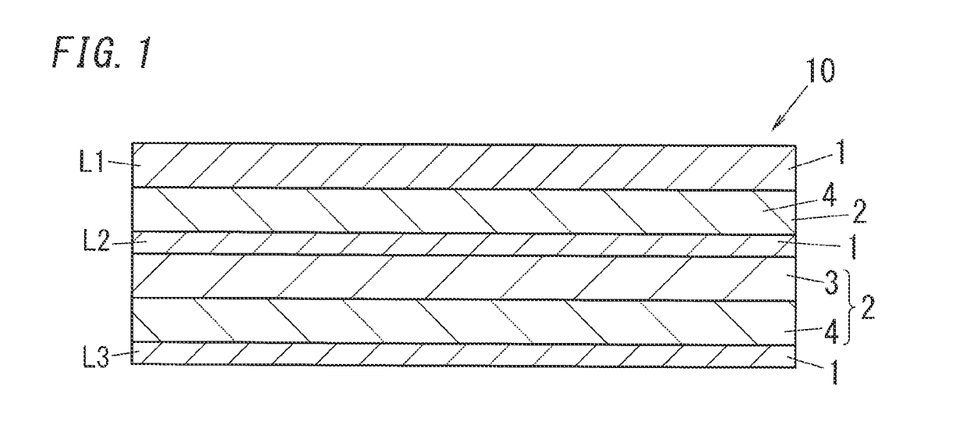
FIG. 1 is a schematic cross-sectional view illustrating an example of a multilayer printed wiring board.

Next, the multilayer printed wiring board 10 according to the present embodiment is explained. The multilayer printed wiring board 10 is manufactured by forming the conductive layer 1 on the multilayer metal-clad laminated board 20. The conductive layer 1 is formed by removing unnecessary parts of the metal layer 5 which serves as one of opposite outermost layers of the multilayer metal-clad laminated board 20 by etching. FIG. 1 illustrates an example of the multilayer printed wiring board 10 according to the present embodiment. The multilayer printed wiring board 10 includes one or more insulating layers 2 and at least one conductive layer 1 which are stacked alternately. The multilayer printed wiring board 10 illustrated in FIG. 1 includes two insulating layers 2 and three conductive layers 1; however, the number of insulating layers 2 and the number of conductive layers 1 are not particularly limited. In the multilayer printed wiring board 10 illustrated in FIG. 1, the conductive layers 1 and the insulating layers 2 are alternately stacked, and two of the conductive layers 1 serve as opposite outermost layers of the multilayer printed wiring board 10 in a thickness direction (stack direction). The conductive layer(s) 1 of the multilayer printed wiring board 10 can be formed by, for example, removing unnecessary parts of one or both of the metal layers 5 serving as the opposite outermost layers of the multilayer metal-clad laminated board 20 by etching. The conductive layers 1 may include, for example, signal layers, power source layers, and ground layers. Note that the conductive layer 1 of the actual multilayer printed wiring board 10 has one or more patterned conductors constituting various circuits; however, the conductive layers 1 are illustrated in a simplified manner in FIG. 1. The metal layer 5 is, for example, a layer formed by spreading metal planarly. Also, conductors such as through hole plating for electrically connecting two or more different conductive layers 1 are not illustrated in FIG. 1.

Since the at least one conductive layer 1 and the one or more insulating layers 2 are stacked alternately and the one or more insulating layers 2 includes at least one liquid crystal polymer resin layer 4 so that each of the one or more insulating layers 2 includes at least one layer selected from a group consisting of at least one polyolefin resin layer 3 and the at least one liquid crystal polymer resin layer 4 instead of including fluororesin layers which require special processing, the multilayer printed wiring board 10 can be processed in the same manner as conventional printed wiring boards such as epoxy resin boards and polyimide resin boards. Also, since a percentage by volume of the at least one liquid crystal polymer resin layer 4 relative to the one or more insulating layers 2 is within a range of 5 to 90%, transmission loss of high speed signals can be reduced. Furthermore, since the multilayer printed wiring board 10 does not include any thermosetting resin layers strengthened with glass cloth but includes the at least one polyolefin resin layer 3, the multilayer printed wiring board 10 can be used as bendable material. Especially, each of the at least one polyolefin resin layer 3 preferably has a storage modulus within a range of $10^5$ to $10^8$ Pa at temperature ranging from 25 to 150° C. after treated at 180° C. for 60 minutes. In this case, thermal shock resistance can be increased and disconnection of through hole plating or the like can be suppressed in the multilayer printed wiring board 10, further leading to improved solder heat resistance during reflow.

If the percentage by volume of the at least one liquid crystal polymer resin layer 4 relative to the one or more insulating layers 2 is less than 5%, transmission loss of high speed signals which are transmitted by the at least one conductive layer 1 might not be reduced enough, and sufficient heat resistance might not be ensured. If the percentage by volume of the at least one liquid crystal polymer resin layer 4 relative to the one or more insulating layers 2 exceeds 90%, thermal expansion coefficient (z-CTE) of the multilayer printed wiring board 10 in the thickness direction (stack direction) increases, leading to low thermal shock resistance resulting in less suppression of disconnection of through hole plating or the like.

As explained above, in the present embodiment, since the one or more insulating layers 2 includes the at least one liquid crystal polymer resin layer 4 so that each of the one or more insulating layers 2 includes at least one layer selected from a group consisting of the at least one polyolefin resin layer 3 and the at least one liquid crystal polymer resin layer 4, the multilayer printed wiring board 10, the multilayer metal-clad laminated board 20, and the resin-coated metal foil 30 can be processed in the same manner as conventional printed wiring boards such as epoxy resin boards and polyimide resin boards. Also, since the percentage by volume of the at least one liquid crystal polymer resin layer 4 relative to the one or more insulating layers 2 is within a range of 5 to 90%, transmission loss of high speed signals can be reduced. Furthermore, since the multilayer printed wiring board 10, the multilayer metal-clad laminated board 20, and the resin-coated metal foil 30 do not include any thermosetting resin layers strengthened with glass cloth, the multilayer printed wiring board 10, the multilayer metal-clad laminated board 20, and the resin-coated metal foil 30 can be used as bendable material.

EXAMPLES

Hereinafter, the present invention is further explained in detail based on examples.

A three-layered printed wiring board as illustrated in FIG. 1 was prepared for each of examples 1 to 5 and comparative example 1. For the sake of easier explanation, three conductive layers 1 (also used to refer to copper foils where patterned conductors are not formed yet) are distinguished by naming them L1 to L3 in this order from one of opposite outermost layers. Note that "PCB configuration" in Table 1 means layered structure of the three-layered printed wiring board. Also, hereinafter, for example, "L1/L2 copper-clad laminated board (or printed wiring board)" means a copper-clad laminated board (or a printed wiring board) which includes L1 and L2 denoting the conductive layers 1, and "L1-L3 three-layered printed wiring board" means a three-layered printed wiring board which includes L1 to L3 denoting all three conductive layers 1. Table 2 and Table 3 show resin compositions for forming polyolefin resin sheets used for the examples 1 to 5 and the comparative example 1.

Example 1-(1) to 1-(11)

Copper foils with thicknesses of 18 μm were stacked on both surfaces of one liquid crystal polymer film with thickness of 50 μm ("Vecstar" available from KURARAY CO., LTD.), which were then heated and pressed at 310° C. for 10 minutes to prepare an L1/L2 liquid crystal polymer copper-clad laminated board. Similarly, a copper foil with thickness of 18 μm was placed on one surface of one liquid crystal polymer film same as the above used one, which were then heated and pressed under the same condition as the above to prepare an L3 liquid crystal polymer copper-clad laminated board.

Subsequently, L2 of the L1/L2 liquid crystal polymer copper-clad laminated board was processed to have a signal layer, and thereby an L1-L2 liquid crystal polymer printed writing board was obtained.

A polyolefin resin sheet with thickness of 25 μm was made of each of the resin compositions (1) to (11) as shown in Table 2. Two polyolefin resin sheets made of the same resin composition were stacked to form an adhesive sheet with thickness of 50 μm. The adhesive sheet was placed between the L1-L2 printed wiring board and the L3 copper-clad laminated board, which were then heated and pressed at 180° C. for 60 minutes, and thereby a three-layered metal-clad laminated board was prepared. Table 3 shows a list of product names and manufacturers of components contained in each of the resin compositions shown in Table 2.

Subsequently, L1 and L3 of the three-layered metal-clad laminated board were processed to have ground layers, and thereby a three-layered printed wiring board was obtained.

Example 2-(1) to 2-(11)

A three-layered printed wiring board was prepared in the same manner as in the example 1, except that metal foils with thicknesses of 12 μm were used and that one polyolefin resin sheet with thickness of 25 μm was used as the adhesive sheet.

Example 3-(1) to 2-(11)

A three-layered printed wiring board was prepared in the same manner as in the example 2, except that liquid crystal polymer films with thicknesses of 25 μm were used and that eight polyolefin resin sheets with thicknesses of 50 μm were used as the adhesive sheet with thickness of 400 μm.

Example 4-(1) to 4-(11)

Copper foils with thicknesses of 12 μm were stacked on both surfaces of one liquid crystal polymer film with thickness of 25 μm ("Vecstar" available from KURARAY CO., LTD.), which were then heated and pressed at 310° C. for 10 minutes to prepare an L1/L2 liquid crystal polymer copper-clad laminated board. Similarly, a copper foil with thickness of 12 μm was placed on one surface of one liquid crystal polymer film same as the above used one, which were then heated and pressed under the same condition as the above to prepare an L3 liquid crystal polymer copper-clad laminated board. Subsequently, as a polyolefin resin, each of the resin compositions (1) to (11) shown in Table 2 was applied on the liquid crystal polymer resin layer of the L3 liquid crystal polymer copper-clad laminated board and then dried to form a polyolefin resin layer with thickness of 25 μm. Accordingly, a liquid crystal polymer one-sided metal-clad laminated board was prepared.

Then, L2 of the L1/L2 liquid crystal polymer copper-clad laminated board was processed to have a signal layer, and thereby an L1-L2 liquid crystal polymer printed wiring board was obtained.

The L1-L2 liquid crystal polymer printed wiring board and the L3 liquid crystal polymer one-sided metal-clad laminated board were stacked, which were then heated and pressed at 180° C. for 60 minutes. Accordingly, a three-layered metal-clad laminated board was prepared.

Subsequently, L1 and L3 of the three-layered metal-clad laminated board were processed to have ground layers, and thereby a three-layered printed wiring board was obtained.

Example 5

A three-layered printed wiring board was prepared in the same manner as in the example 1, except that one polyolefin resin sheet with thickness of 25 μm formed of the resin composition (12) shown in Table 2 was used as the polyolefin resin sheet.

Comparative Example 1

A three-layered printed wiring board was prepared in the same manner as in the example 1, except that a glass cloth-strengthened polyphenylene ether resin prepreg (a prepreg which is strengthened with glass cloth and contains polyphenylene ether resin) with thickness of 100 was used as the adhesive sheet.

Following evaluations were carried out for each of the examples and comparative example.
(Transmission Loss)
Transmission loss in the signal layer of L2 at 5 GHz was measured for the three-layered printed wiring board of each of the examples and comparative example. The results are shown in Table
(Bendability)
For the three-layered printed wiring board of each of the examples and comparative example, a patterned conductor of L (line)/S (space)=1/1 mm was formed in L1, and bendability was measured by MIT method (JIS P 8115). The results are shown in Table 1.
(Heat resistance)
For the three-layered printed wiring board of each of the examples and comparative example, a patterned copper of a 25 mm square was formed in L1. Heat resistance (JIS C 5012 10.4.1) in solder float at normal condition (less than or equal to 30° C., less than or equal to 60% Rh) and after moisture condition (60° C., 60% Rh, 120H) was measured. The results are shown in Table 1.

TABLE 1

Examples and comparative examples

| | | Example 1-(1) to 1-(11) | Example 2-(1) to 2-(11) | Example 3-(1) to 3-(11) |
|---|---|---|---|---|
| PCB configuration | L1 | Copper foil 18 μm | Copper foil 12 μm | Copper foil 12 μm |
| | Liquid crystal polymer | Liquid crystal polymer film 50 μm | Liquid crystal polymer film 50 μm | Liquid crystal polymer film 25 μm |
| | L2 | Copper foil 18 μm | Copper foil 12 μm | Copper foil 12 μm |
| | Adhesive sheet | Polyolefin resin sheet* 50 μm (stacked two 25 μm sheets) *Compositions (1) to (11) in Table 2 | Polyolefin resin sheet* 25 μm (one 25 μm sheet) *Compositions (1) to (11) in Table 2 | Polyolefin resin sheet* 400 μm (stacked eight 50 μm sheets) *Compositions (1) to (11) in Table 2 |
| | Liquid crystal polymer | No copper foil Liquid crystal polymer film 50 μm | No copper foil Liquid crystal polymer film 50 μm | No copper foil Liquid crystal polymer film 25 μm |
| | L3 | Copper foil 18 μm | Copper foil 12 μm | Copper foil 12 μm |
| LCP resin layer (volume %) | | 67% | 80% | 11% |
| Transmission loss (5 GHz) | | Good | Good | Good |
| Bendability (MIT) | | 100 times or more Good | 100 times or more Good | 100 times or more Good |
| Heat resistance (normal condition) (solder float) | | 300° C. Good | 300° C. Good | 300° C. Good |
| Heat resistance (after moisture absorption) (solder float) | | 290° C. Good | 290° C. Good | 290° C. Good |

| | | Example 4-(1) to 4-(11) | Example 5 | Comparative example 1 |
|---|---|---|---|---|
| PCB configuration | L1 | Copper foil 12 μm | Copper foil 18 μm | Copper foil 18 μm |
| | Liquid crystal polymer | Liquid crystal polymer film 25 μm | Liquid crystal polymer film 50 μm | Liquid crystal polymer film 50 μm |
| | L2 | Copper foil 12 μm | Copper foil 18 μm | Copper foil 18 μm |
| | Adhesive sheet | — | Polyolefin resin sheet* 25 μm (one 25 μm sheet) *Composition (12) in Table 2 | Glass cloth-strengthened polyphenylene ether resin PP 100 μm |
| | Liquid crystal polymer | Adhesive sheet 25 μm* Liquid crystal polymer film 25 μm | No copper foil Liquid crystal polymer film 50 μm | No copper foil Liquid crystal polymer film 50 μm |
| | L3 | Copper foil 12 μm *Compositions (1) to (11) in Table 2 | Copper foil 18 μm | Copper foil 18 μm |
| LCP resin layer (volume %) | | 67% | 80% | 50% |
| Transmission loss (5 GHz) | | Good | Good | Good |

TABLE 1-continued

| Examples and comparative examples | | | |
|---|---|---|---|
| Bendability (MIT) | 100 times or more<br>Good | Less than 100 times<br>Slightly good | 0 time<br>Poor |
| Heat resistance<br>(at normal condition)<br>(solder float) | 300° C.<br>Good | 300° C.<br>Good | 300° C.<br>Good |
| Heat resistance<br>(after moisture absorption)<br>(solder float) | 290° C.<br>Good | 260° C.<br>Slightly good | 290° C.<br>Good |

TABLE 2

Resin compositions for polyolefin resin sheets used in examples and comparative example (unit: parts by mass)

| Resin compositions for polyolefin resin sheets | | (1) | (2) | (3) | (4) | (5) | (6) | (7) | (8) | (9) | (10) | (11) | (12) |
|---|---|---|---|---|---|---|---|---|---|---|---|---|---|
| Component (A) | 1 SEPS | 100 | | | | | | | 50 | 100 | 50 | 150 | 100 |
| | 2 SEEPS | | 100 | | | | | | 50 | | | | |
| | 3 SEBS | | | 100 | | | | | | | | | |
| | 4 SIS | | | | 100 | | | | | | | | |
| | 5 Hydrogenated SIBS | | | | | 100 | | | | | | | |
| | 6 SBBS | | | | | | 100 | | | | | | |
| | 7 E-GMA-MA | | | | | | | 100 | | | | | |
| Component (B) | 1 Epoxy | 30 | 20 | | | | | | | | | | |
| | 2 Phenol 1 | | 10 | | | | | | | | | | |
| | 3 Phenol 2 | | | 20 | | 5 | | | | | | | |
| | 4 Phenol 3 | | | | 5 | | | | | | | | |
| | 5 BMI 1 | | | | 25 | 10 | | | | | | | |
| | 6 BMI 2 | | | | | | 10 | 10 | 10 | 10 | 10 | 10 | |
| | 7 OPE-Vn | | | | | 15 | 20 | 20 | 20 | 20 | 20 | 20 | 150 |
| Component (C) | 1 Curing accelerator | 0.3 | 0.1 | — | — | — | — | — | — | — | — | — | — |
| Component (D) | 1 Silica | — | — | — | — | — | — | — | — | 10 | — | — | — |

TABLE 3

Components of resin compositions for polyolefin resin sheets used in examples and comparative example

| Resin compositions for polyolefin resin sheets | | | Manufacturer | Product name |
|---|---|---|---|---|
| Component (A) | 1 | SEPS | KURARAY CO., LTD. | SEPTON 2007 |
| | 2 | SEEPS | KURARAY CO., LTD. | SEPTON 4055 |
| | 3 | SEBS | Asahi Kasei Corporation | Tuftec H1221 |
| | 4 | SIS | ZEON CORPORATION | Quintac 3450 |
| | 5 | Hydrogenated SIBS | KURARAY CO., LTD. | HYBRAR 7311 |
| | 6 | SBBS | Asahi Kasei Corporation | Tuftec P1500 |
| | 7 | E-GMA-MA | Sumitomo Chemical Co., Ltd. | BONDFAST 7M |
| Component (B) | 1 | Epoxy | DIC CORPORATION | EPICLON HP7200 |
| | 2 | Phenol 1 | SHOWA DENKO K.K. | Shonol CKM2400 |
| | 3 | Phenol 2 | SHOWA DENKO K.K. | Shonol CKM908 |
| | 4 | Phenol 3 | Gunei Chemical Industry Co., Ltd. | Resitop PS-2655 |
| | 5 | BMI 1 | K•I Chemical Industry Co., LTD. | BMI-70 |
| | 6 | BMI 2 | K•I Chemical Industry Co., LTD. | BMI-80 |
| | 7 | OPE-Vn | MITSUIBISHI GAS CHEMICAL COMPANY, INC. | OPE-2St-2200 |
| Component (C) | 1 | Curing accelerator | Chemical reagent | 2-ethyl-4-methyl imidazole |
| Component (D) | 1 | Silica | NIPPON AEROSIL CO., LTD. | AEROSIL 200 |

In each of the examples 1 to 4, the results of the evaluations carried out on the three-layered printed wiring boards prepared by using 11 kinds of the resin compositions come out same.

As indicated from Table 1, each of the examples 1 to 5 exhibited better bendability than the comparative example 1. Since the glass cloth-strengthened polyphenylene ether resin prepreg was used in the comparative example 1, the comparative example 1 did not exhibit any bendability.

Furthermore, each of the examples 1 to 4 was more excellent in bendability compared to the example 5 and also exhibited better solder heat resistance after moisture absorption than the example 5. Since each of the examples 1 to 4 contains more elastomer than the example 5, each of the examples 1 to 4 was more excellent in flexibility, leading to better bendability. Moreover, since the used resins had large mechanical strength, the examples 1 to 4 exhibited better heat resistance.

What is claimed is:

1. A multilayer printed wiring board, comprising:
   a plurality of insulating layers disposed in a thickness direction; and a plurality of conductive layers disposed in the thickness direction, between any two conductive layers adjacent in the thickness direction of the plurality of conductive layers, at least one of the plurality of insulating layers being disposed, one or more of the plurality of insulating layers being polyolefin resin layers and the other of the plurality of insulating layers being liquid crystal polymer resin layers, a percentage by volume of all of the liquid crystal polymer resin layers relative to all of the plurality of insulating layers being within a range of 5 to 90%, each of the polyolefin resin layers containing a component (A) representing polyolefin-based elastomer and a component (B) representing thermosetting resin, the component (A) representing polyolefin-based elastomer is selected from the group consisting of: polystyrene-polyisoprene block copolymer, hydrogenated polystyrene-polyisoprene-polybutadiene block copolymer, polystyrene-poly(butadienebutylene)block-polystyrene copolymer, ethylene-glycidyl methacrylate copolymer, ethylene-glycidyl methacrylate-acrylic acid methyl copolymer, and ethylene-glycidyl methacrylate-vinyl acetate copolymer, or mixtures thereof, the component (B) representing thermosetting resin is selected from the group consisting of epoxy resin, phenol resin, and bismaleimide resin or mixtures thereof.

2. The multilayer printed wiring board of claim 1, wherein two or more of the plurality of insulating layers are disposed between two of the plurality of conductive layers adjacent in the thickness direction.

3. The multilayer printed wiring board of claim 1, wherein the plurality of conductive layers include a signal layer, a power source layer, or a ground layer.

4. The multilayer printed wiring board of claim 3, wherein the plurality of conductive layers includes the signal layer.

5. The multilayer printed wiring board of claim 4, wherein the signal layer is in contact with one of the liquid crystal polymer resin layers.

6. The multilayer printed wiring board of claim 4, wherein the signal layer is disposed between two insulating layers of the plurality of insulating layers.

7. The multilayer printed wiring board of claim 4, wherein the signal layer includes a circuit for transmitting a high speed signal.

8. The multilayer printed wiring board of claim 1, wherein one or two conductive layers of the plurality of conductive layers are disposed at outermost sides in the thickness direction.

9. The multilayer printed wiring board of claim 8, wherein the one or two conductive layers are ground layers.

10. The multilayer printed wiring board of claim 1, wherein
each of the plurality of insulating layers contains no glass cloth.

11. The multilayer printed wiring board of claim 1, wherein a percentage by weight of the component (A) representing polyolefin-based elastomer relative to all of the polyolefin resin layers is within a range of 50 to 95%.

12. The multilayer printed wiring board of claim 1, wherein each of the polyolefin resin layers further contains a component (C) representing curing accelerator.

13. The multilayer printed wiring board of claim 1, wherein each of the polyolefin resin layers further contains a component (D) representing filler.

14. The multilayer printed wiring board of claim 1, wherein
the polyolefin resin layers each have a storage modulus within a range of 105 to 108 Pa at a temperature ranging from 25 to 150° C. after treated at 180° C. for 60 minutes.

15. The multilayer printed wiring board of claim 1, wherein
a percentage by weight of the component (B) representing thermosetting resin relative to all of the polyolefin resin layers is within a range of 5 to 50%.

16. A multilayer metal-clad laminated board, comprising:
a plurality of insulating layers disposed in a thickness direction; and
a plurality of conductive layers disposed in the thickness direction,
between any two conductive layers adjacent in the thickness direction of the plurality of conductive layers, at least one of the plurality of insulating layers being disposed,
one or more of the plurality of insulating layers being polyolefin resin layers and the other of the plurality of insulating layers being liquid crystal polymer resin layers,
a percentage by volume of all of the liquid crystal polymer resin layers relative to all of the plurality of insulating layers being within a range of 5 to 90%,
each of the polyolefin resin layers containing a component (A) representing polyolefin-based elastomer and a component (B) representing thermosetting resin,
the component (A) representing polyolefin-based elastomer is selected from the group consisting of: polystyrene-polyisoprene block copolymer, hydrogenated polystyrene-polyisoprene-polybutadiene block copolymer, polystyrene-poly(butadienebutylene)block-polystyrene copolymer, ethylene-glycidyl methacrylate copolymer, ethylene-glycidyl methacrylate-acrylic acid methyl copolymer, and ethylene-glycidyl methacrylate-vinyl acetate copolymer, or mixtures thereof,
the component (B) representing thermosetting resin is selected from the group consisting of epoxy resin, phenol resin, and bismaleimide resin or mixtures thereof,
one or two conductive layers of the plurality of conductive layers being disposed at outermost sides in the thickness direction, the one or two conductive layers being metal layers each extending in a plane vertical to the thickness direction.

17. The multilayer metal-clad laminated board of claim 16, wherein
a percentage by weight of the component (B) representing thermosetting resin relative to all of the polyolefin resin layers is within a range of 5 to 50%.

18. A resin-coated metal foil, comprising:
a metal foil;
a liquid crystal polymer resin layer disposed on one surface of the metal foil; and
a polyolefin resin layer disposed on an opposite side of the liquid crystal polymer resin layer from the metal foil,
the polyolefin resin layer being semi-cured,
a percentage by volume of the liquid crystal polymer resin layer relative to a total of the liquid crystal polymer resin layer and the polyolefin resin layer being within a range of 5 to 90%,
the polyolefin resin layer containing a component (A) representing polyolefin-based elastomer and a component (B) representing thermosetting resin, the component (A) representing polyolefin-based elastomer is selected from the group consisting of polystyrene-polyisoprene block copolymer; hydrogenated polystyrene-polyisoprene-polybutadiene block copolymer; polystyrene-poly(butadienebutylene)block-polystyrene copolymer; ethylene-glycidyl methacrylate copolymer; ethylene-glycidyl methacrylate-acrylic acid methyl copolymer; and ethylene-glycidyl methacrylate-vinyl acetate copolymer, or mixtures thereof, the component (B) representing thermosetting resin is selected from the group consisting of epoxy resin, phenol resin, and bismaleimide resin or mixtures thereof.

19. The resin-coated metal foil of claim 18, wherein the polyolefin resin layer is a first polyolefin resin layer, and the resin-coated metal foil further includes a second polyolefin resin layer disposed between the liquid crystal polymer resin layer and the first polyolefin resin layer.

20. The resin-coated metal foil of claim 18, wherein a percentage by weight of the component (B) representing thermosetting resin relative to the polyolefin resin layer is within a range of 5 to 50%.

* * * * *